United States Patent
Levy

(10) Patent No.: US 12,069,829 B2
(45) Date of Patent: Aug. 20, 2024

(54) DUAL CONNECT SWITCH MODULE

(71) Applicant: MELLANOX TECHNOLOGIES, LTD., Yokneam (IL)

(72) Inventor: Ofer Levy, Kiryat Ono (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 528 days.

(21) Appl. No.: 17/532,937

(22) Filed: Nov. 22, 2021

(65) Prior Publication Data
US 2023/0164944 A1 May 25, 2023

(51) Int. Cl.
*H04M 3/00* (2024.01)
*H04L 49/40* (2022.01)
*H05K 7/14* (2006.01)

(52) U.S. Cl.
CPC ......... *H05K 7/1452* (2013.01); *H04L 49/405* (2013.01); *H05K 7/1402* (2013.01); *H05K 7/1451* (2013.01); *H05K 7/1488* (2013.01)

(58) Field of Classification Search
CPC .. H05K 7/1452; H05K 7/1402; H05K 7/1451; H05K 7/1488; H04L 49/405
USPC .................................................. 379/327, 328
See application file for complete search history.

(56) References Cited

U.S. PATENT DOCUMENTS

| | | | | |
|---|---|---|---|---|
| 6,564,274 B1 * | 5/2003 | Heath | ...................... | G06F 13/40 333/236 |
| 7,686,620 B2 * | 3/2010 | Liao | ...................... | H05K 7/1069 439/71 |
| 2003/0211782 A1 * | 11/2003 | Esparaz | ............. | H01R 13/6658 439/620.11 |
| 2006/0223343 A1 * | 10/2006 | Campini | .............. | H05K 7/1461 439/64 |
| 2007/0081315 A1 * | 4/2007 | Mondor | ................. | H04Q 1/116 361/788 |
| 2010/0061391 A1 * | 3/2010 | Sindhu | ................... | H04L 49/356 370/474 |
| 2012/0189004 A1 * | 7/2012 | Hendel | .................... | H04L 45/72 370/360 |
| 2014/0106582 A1 * | 4/2014 | Wig | .................. | H04L 12/40013 439/78 |
| 2018/0076587 A1 * | 3/2018 | Herring | ................... | H01R 27/02 |
| 2018/0270955 A1 * | 9/2018 | Herring | ............... | H01R 12/716 |
| 2018/0309213 A1 * | 10/2018 | Harmon, III | ......... | H01R 12/716 |
| 2019/0103707 A1 * | 4/2019 | Tryson | ............... | H01R 12/7005 |
| 2020/0293218 A1 * | 9/2020 | Nakahara | ................ | H04L 67/12 |
| 2022/0237113 A1 * | 7/2022 | Woo | .................... | G06F 12/0882 |

(Continued)

*Primary Examiner* — William J Deane, Jr.
(74) *Attorney, Agent, or Firm* — Sheridan Ross P.C.

(57) ABSTRACT

A dual connect switch module may include a first set of pluggable panel connectors on a first side of a substrate of the switch and a second set of pluggable panel connectors on an opposing second side of the substrate. The switch module further includes a switch Integrated Circuit (IC) mounted between the first side and the second side, where the switch IC is connected to the first set of pluggable panel connectors and to the second set of pluggable panel connectors. A cable can be used to connect at least one pluggable panel connector of the first set of pluggable panel connectors and/or of the second set of pluggable panel connectors with a port of an external network device. In some examples, the switch and substrate may further include a management module that manages one or more on-board functions of the switch module.

23 Claims, 6 Drawing Sheets

(56) References Cited

U.S. PATENT DOCUMENTS

2023/0018854 A1\* 1/2023 Martin ................ H04L 63/0435
2023/0411270 A1\* 12/2023 Hayashi ............. H01L 23/3675

\* cited by examiner

DUAL CONNECT SWITCH MODULE

FIELD OF THE DISCLOSURE

The present disclosure is generally directed to systems, methods, and devices for network switches, in particular, toward a dual connect switch module.

BACKGROUND

Network switches are used in networking systems, like datacenters, for routing data between endpoints. With being placed into chassis units, the construction and design of the network switches may be dependent on the design of the chassis units and/or systems of which the network switches are a part (e.g., director switches, dragonfly network topologies, fat-tree topologies, etc.). Accordingly, if the design of the chassis units and/or systems of which the network switches are a part are adjusted, an updated design of the network switches, new concepts, and technologies should be developed. However, developing new concepts, technologies, and designs of network switches with each chassis unit and/or system development is inefficient and wasteful by requiring replacement of old equipment that does not conform with the chassis unit and/or system developments.

BRIEF SUMMARY

In an illustrative embodiment, a switch comprises a substrate having a first side and an opposing second side; a first set of pluggable panel connectors provided on the first side of the substrate; a second set of pluggable panel connectors provided on the second side of the substrate; and a switch Integrated Circuit (IC) mounted on the substrate between the first side and the second side, where the switch IC is connected to the first set of pluggable panel connectors and to the second set of pluggable panel connectors.

In at least one embodiment, the substrate is mounted in a chassis such that one of the first set of pluggable panel connectors and the second set of pluggable panel connectors are exposed on a side of the chassis that is accessible for plugging and unplugging cables.

In at least one embodiment, a cable connects at least one pluggable panel connector in the first set of pluggable panel connectors with a port of an external network device.

In at least one embodiment, a cable connects at least one pluggable panel connector in the second set of pluggable panel connectors with an external network device.

In at least one embodiment, the switch IC is connected to the first set of pluggable panel connectors with at least one of electrical traces, wires, and optical connections.

In at least one embodiment, the switch further comprises a power supply unit mounted on the substrate, where the power supply unit provides power to the switch IC.

In at least one embodiment, the switch further comprises a second switch IC mounted on the substrate, where each pluggable panel connector in the first set of pluggable panel connectors is connected to one of the switch IC and the second switch IC, and where each pluggable panel connector in the second set of pluggable panel connectors is connected to both of the switch IC and the second switch IC.

In at least one embodiment, lanes of the second set of pluggable panel connectors are split between the switch IC and the second switch IC.

In at least one embodiment, a number of pluggable panel connectors in the first set of pluggable panel connectors is equal to a number of pluggable panel connectors in the second set of pluggable panel connectors.

In at least one embodiment, each pluggable panel connector in the first set of pluggable panel connectors is configured to receive a pluggable cable, and each pluggable panel connector in the second set of pluggable panel connectors is configured to receive another pluggable cable.

In at least one embodiment, the first set of pluggable panel connectors and the second set of pluggable panel connectors operate using a common communication protocol.

In at least one embodiment, the switch further comprises a management module that manages one or more on-board functions of the switch.

In at least one embodiment, the one or more on-board functions managed by the management module comprise at least one of cooling functions, power supply functions, security functions, and data transfer functions.

In at least one embodiment, the switch IC is connected to the first set of pluggable panel connectors and to the second set of pluggable panel connectors via an electrical connection.

In at least one embodiment, the switch IC is connected to the first set of pluggable panel connectors and to the second set of pluggable panel connectors via an optical connection.

In an illustrative embodiment, a system comprises a chassis; a cable; and a switch mounted in the chassis. The switch comprises a first set of pluggable panel connectors provided on a first side of the switch; a second set of pluggable panel connectors provided on a second side of the switch, where at least one pluggable panel connector in the second set of pluggable panel connectors is connected to the cable; and a switch IC mounted between the first side and the second side, where the switch IC is electrically connected to the first set of pluggable panel connectors and to the second set of pluggable panel connectors.

In at least one embodiment, the system further comprises a second switch mounted in the chassis and connected to the switch via the cable.

In at least one embodiment, the second switch comprises a first set of pluggable panel connectors provided on a first side of the second switch; a second set of pluggable panel connectors provided on a second side of the second switch; and a second switch IC mounted between the first side of the second switch and the second side of the second switch, where the second switch IC is connected to the first set of pluggable panel connectors of the second switch and to the second set of pluggable panel connectors of the second switch.

In at least one embodiment, the cable connects at least one pluggable panel connector in at least one of the first set of pluggable panel connectors and the second set of pluggable panel connectors with a port of an external network device.

In at least one embodiment, the switch IC is connected to the first set of pluggable panel connectors with at least one of electrical traces, wires, and optical connections, and the switch IC is connected to the second set of pluggable panel connectors with at least one of electrical traces, wires, and optical connections.

In at least one embodiment, the switch of the system further comprises a management module that manages one or more on-board functions of the switch, where the one or more on-board functions managed by the management module comprise at least one of cooling functions, power supply functions, security functions, and data transfer functions.

In an illustrative embodiment, a switch comprises a first set of pluggable panel connectors provided on a first side of the switch; a second set of pluggable panel connectors provided on a second side of the switch; a first switch IC mounted between the first side of the switch and the second side of the switch, where the first switch IC is connected to the first set of pluggable panel connectors and the second set of pluggable panel connectors; and a second switch IC mounted between the first side of the switch and the second side of the switch, where the second switch IC is connected to the first set of pluggable panel connectors and the second set of pluggable panel connectors.

In at least one embodiment, each pluggable panel connector in the first set of pluggable panel connectors is connected to one of the first switch IC and the second switch IC, and each pluggable panel connector in the second set of pluggable panel connectors is connected to both of the first switch IC and the second switch IC.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

The present disclosure is described in conjunction with the appended figures, which are not necessarily drawn to scale.

DETAILED DESCRIPTION

Figure 1:
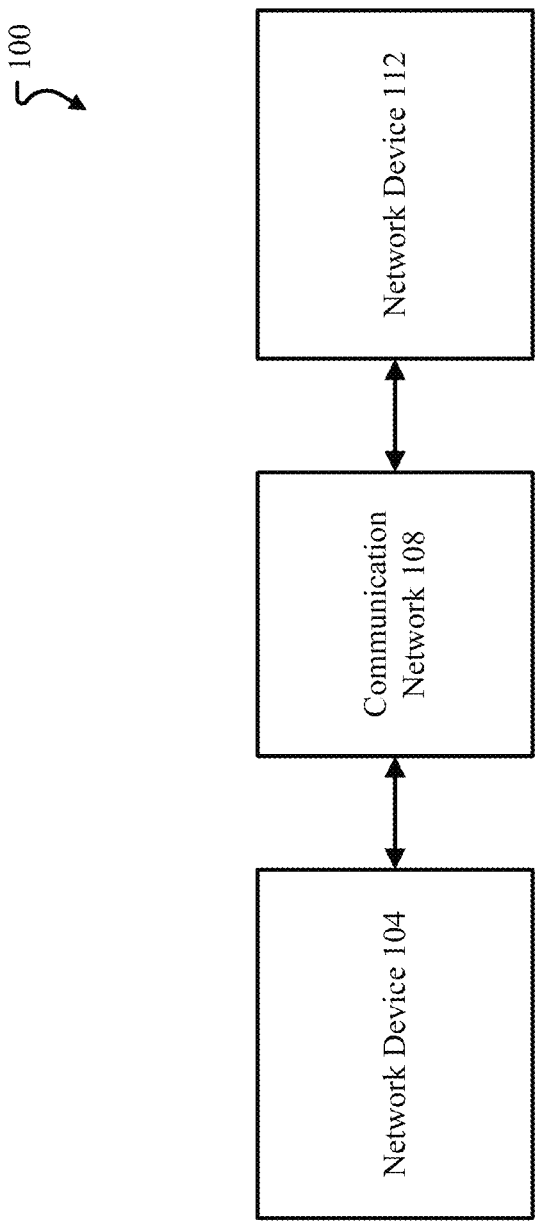
FIG. 1 illustrates a block diagram of a networking system according to at least one example embodiment of the present disclosure.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It will be appreciated from the following description, and for reasons of computational efficiency, that the components of the system can be arranged at any appropriate location within a distributed network of components without impacting the operation of the system.

Further, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a Printed Circuit Board (PCB), or the like.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

In some cases, switch systems (e.g., director switches) are built from a single and complex chassis unit that connects between other chassis units, other switch systems, leaf/spine switches, management modules, power units, cooling units, input/output (I/O) units, etc. With the rising number of port counts and speed, the chasses designed for these switch systems have become cumbersomely large, heavy, and complex. For example, due to the large size and complexity, the required effort and resources used in order to develop, qualify, validate, produce, test, ship, etc., have become excessive. Additionally, developing different sizes or different topologies for the switch systems require a completely new design cycle of the chassis and, in some cases, of additional units (e.g., new designs for network switches that are part of the switch systems). In some examples, for every new generation or variation of switch system, a completely new concept and new technologies should be developed. As a non-limiting example, a configuration for a director switch structure can require a special and customized leaf/spine interconnect solution (e.g., from a single source) with a complex replacement in the field.

It is with respect to the above issues and other problems that the embodiments presented herein were contemplated.

Inventive concepts relate to a design for a switch (e.g., a dual connect switch module) that includes a first set of pluggable panel connectors (e.g., first set of ports) on a first side of a substrate of the switch and a second set of pluggable panel connectors (e.g., second set of ports) on an opposing second side of the substrate. The switch further includes a switch Integrated Circuit (IC) mounted between the first side and the second side, where the switch IC is connected (e.g., via an electrical connection, optical connection, etc.) to the first set of pluggable panel connectors and to the second set of pluggable panel connectors. Additionally, the switch and substrate are mounted in a chassis such that one of the first set of pluggable panel connectors and the second set of pluggable panel connectors are exposed on a side of the chassis that is accessible for plugging and unplugging cables. Accordingly, a cable can then be used to connect at least one pluggable panel connector of the first set of pluggable panel connectors and/or of the second set of pluggable panel connectors with a port of an external network device. In some examples, the switch and substrate may further include a management module that manages one or more on-board functions of the switch, such as cooling functions, power supply functions, security functions, data transfer functions, etc.

In some examples, the construction and design of a modular director chassis (e.g., manufactured to hold one or more network switches) is passive, which makes its production, quality assurance, and development flows easier and more efficient. Subsequently, using the standalone concept of the switch described above (e.g., the dual connect switch module, which can be used for leaf switches and spine switches, among other examples), the design, test, and quality flows of these standalone switches are transformed into simpler flows (e.g., from director flows into Top of Rack (ToR) flows). Due to the modular structure of this standalone switch concept, many switch topologies and sizes can be built easily by mounting the switches (e.g., leaf and spine switches) on passive racks and connecting them with standard cables. By having the connection between the switches (e.g., spines and leaves) done by standard cables, which are a common interconnect solution, this standalone switch concept can be part of a complete fabric solution for multiple generations of switch and switch system designs in the future. Additionally, in case of a link failure in one of the cables, a single cable replacement is required for this standalone switch concept, which is a simple operation.

The standalone switch concept is built as a sub-system that can work on its own and requires the same resources as a standard ToR switch and can be mounted on a standard rack. For example, the switch is built from two switch devices, where half of each switch device ports (e.g., pluggable panel connectors) are routed toward a first side of the switch (e.g., front-facing side) and the other half are routed toward a second side of the switch (e.g., rear-facing side, a cable backplane side for a director switch, opposing side of the first side, etc.). The interconnect between switches built using this standalone concept is done by cables connection on one side of the chassis, and external ports (e.g., for connecting to external network devices) of the concept are located on the other side. This topology minimizes the cable length in order to converge into cable capabilities. In order to create a single connection fat-tree topology, each port of the switch (e.g., Octal Small Form Factor Pluggable (OSFP) ports and cables) are routed into different switch ICs (e.g., different switch devices) on the same subsystem (e.g., same leaf system) by using an internal wiring connection between the ports and the two switch devices (e.g., on the same switch or on different switches).

FIG. 1 illustrates a system 100 according to at least one example embodiment. The system 100 includes a network device 104, a communication network 108, and a network device 112. In at least one example embodiment, network devices 104 and 112 may correspond a network switch (e.g., an Ethernet switch), a collection of network switches, a network interface controller (NIC), or any other suitable device used to control the flow of data between devices connected to communication network 108. Each network device 104 and 112 may be connected to one or more of Personal Computer (PC), a laptop, a tablet, a smartphone, a server, a collection of servers, or the like. In one specific, but non-limiting example, each network device 104 and 112 includes multiple network switches in a fixed configuration or in a modular configuration.

Examples of the communication network 108 that may be used to connect the network devices 104 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables communication between the network devices 104 and 112 using Ethernet technology. In one specific, but non-limiting example, the network devices 104 and 112 correspond to director switches that may have a modular configuration. As discussed in more detail below, a network switch (e.g., a director switch) according to inventive concepts may implement multiple layers of a network topology as field replaceable units (FRUs) or customer replaceable units (CRUs) within a single chassis.

Although not explicitly shown, the network device 104 and/or the network device 112 may include storage devices and/or processing circuitry for carrying out computing tasks, for example, tasks associated with controlling the flow of data within each network device 104 and 112 and/or over the communication network 108. Such processing circuitry may comprise software, hardware, or a combination thereof. For example, the processing circuitry may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random-Access Memory (RAM), Read-Only Memory (ROM), variants thereof, combinations thereof, or the like. In some embodiments, the memory and processor may be integrated into a common device (e.g., a microprocessor may include integrated memory). Additionally or alternatively, the processing circuitry may comprise hardware, such as an application specific integrated circuit (ASIC). Other non-limiting examples of the processing circuitry include an IC chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry may be provided on a PCB or collection of PCBs. It should be appreciated that any appropriate type of electrical component or collection of electrical components may be suitable for inclusion in the processing circuitry.

In addition, although not explicitly shown, it should be appreciated that the network devices 104 and 112 include one or more communication interfaces for facilitating wired and/or wireless communication between one another and other unillustrated elements of the system 100.

Figure 2:
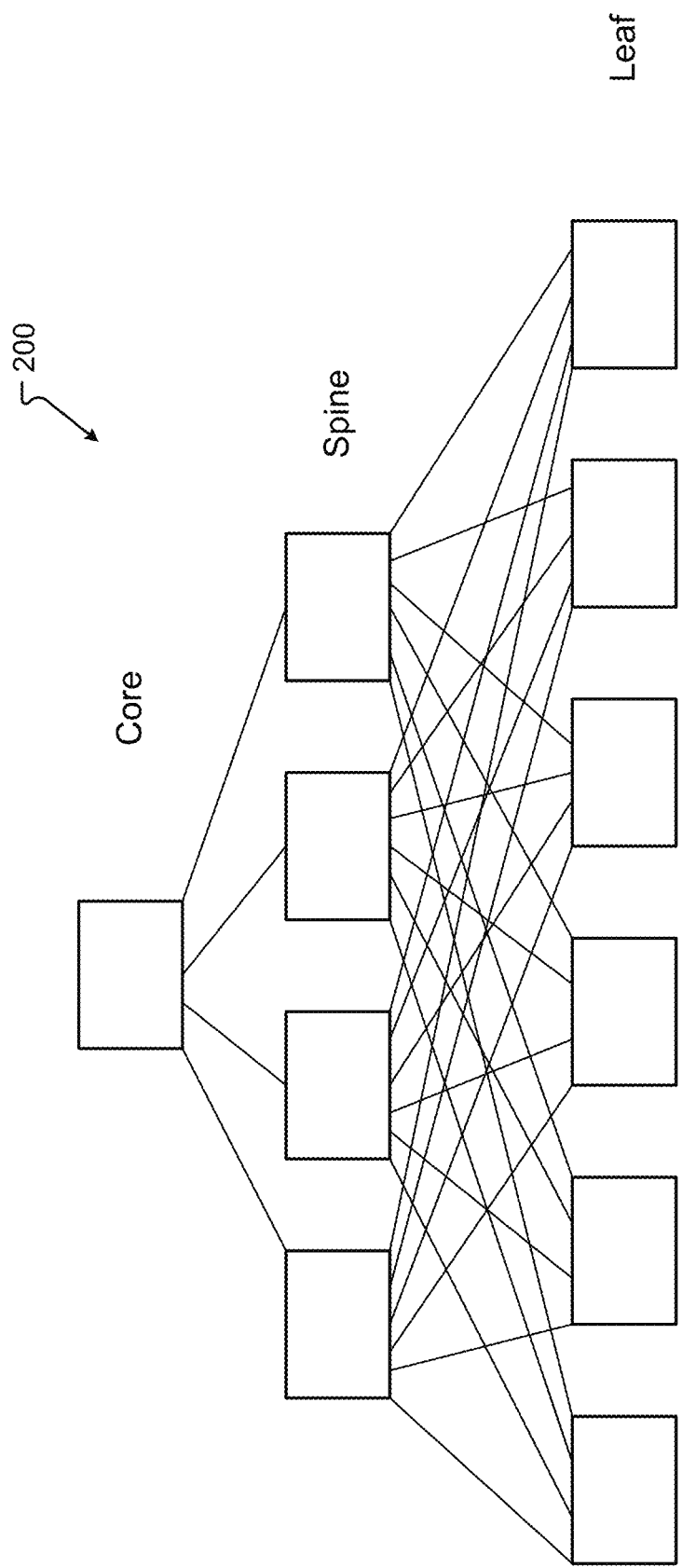
FIG. 2 illustrates a networking topology according to at least one example embodiment of the present disclosure.

FIG. 2 illustrates a networking topology 200 according to at least one example embodiment. The topology 200 is a three-tier topology with core, spine (or aggregation), and leaf (or access) layers. Each box of each layer represents a collection of network switches that is repeated for that layer. Although not explicitly shown, endpoints that comprise servers and/or user terminals may be connected to the leaf layer. Here, it should be appreciated that example embodiments are not limited to the topology 200, and inventive concepts may be applied to other suitable network topologies (e.g., a two-tier topology with spine and leaf layers, dragonfly network topologies, etc.). As discussed in more detail below, example embodiments relate to a modular network switch structure capable of accommodating or supporting different switch topologies and sizes that also enables the use of standard cables for connections between switches, network devices, etc., thereby simplifying maintenance operations (e.g., if a cable fails) and reducing a need of redesigns and replacement of network switches for future generations and designs of switch systems.

Figure 3A:
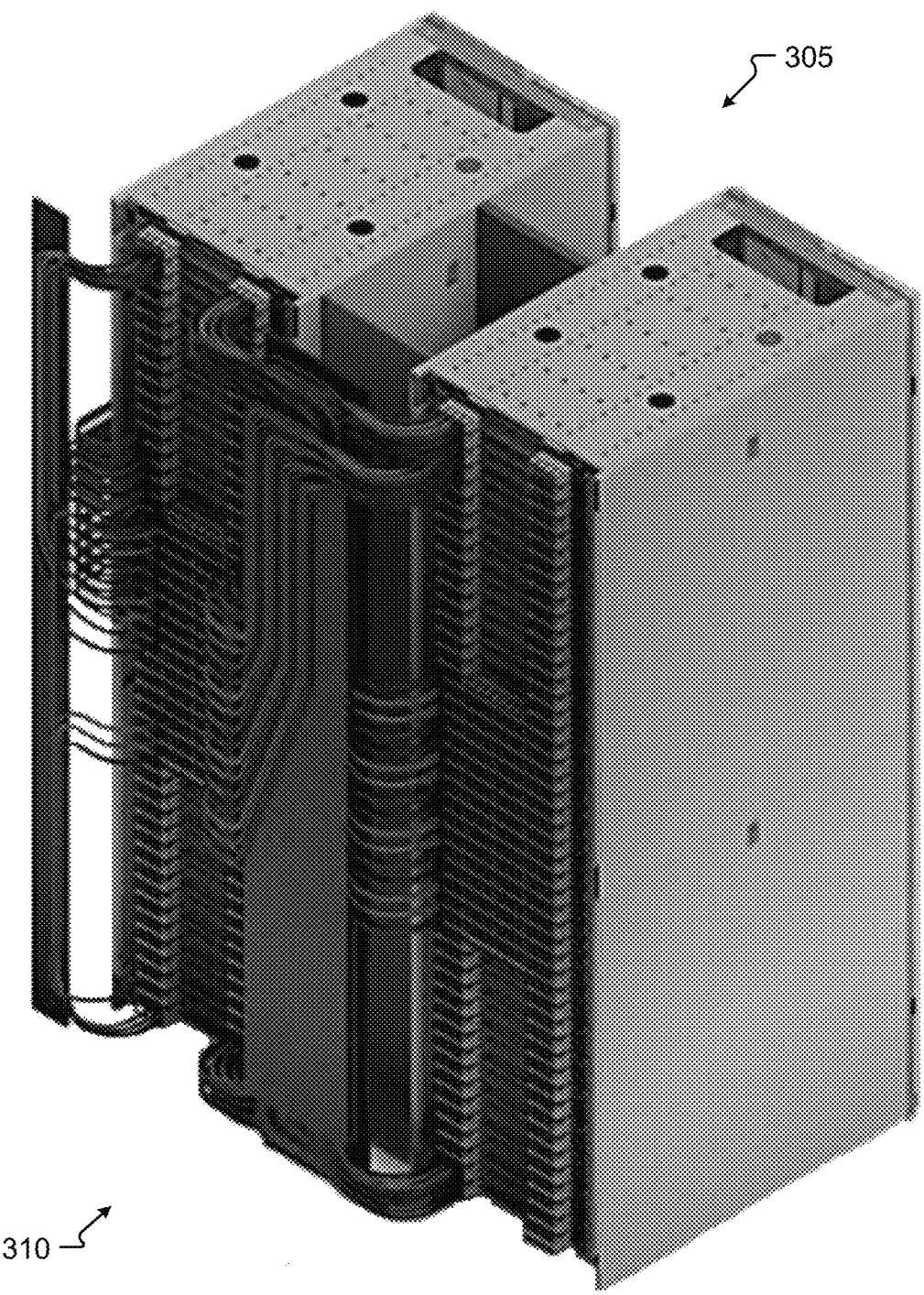
FIGS. 3A to 3C illustrate a switch system that includes at least one network switch in accordance with embodiments of the present disclosure.
Figure 3B:
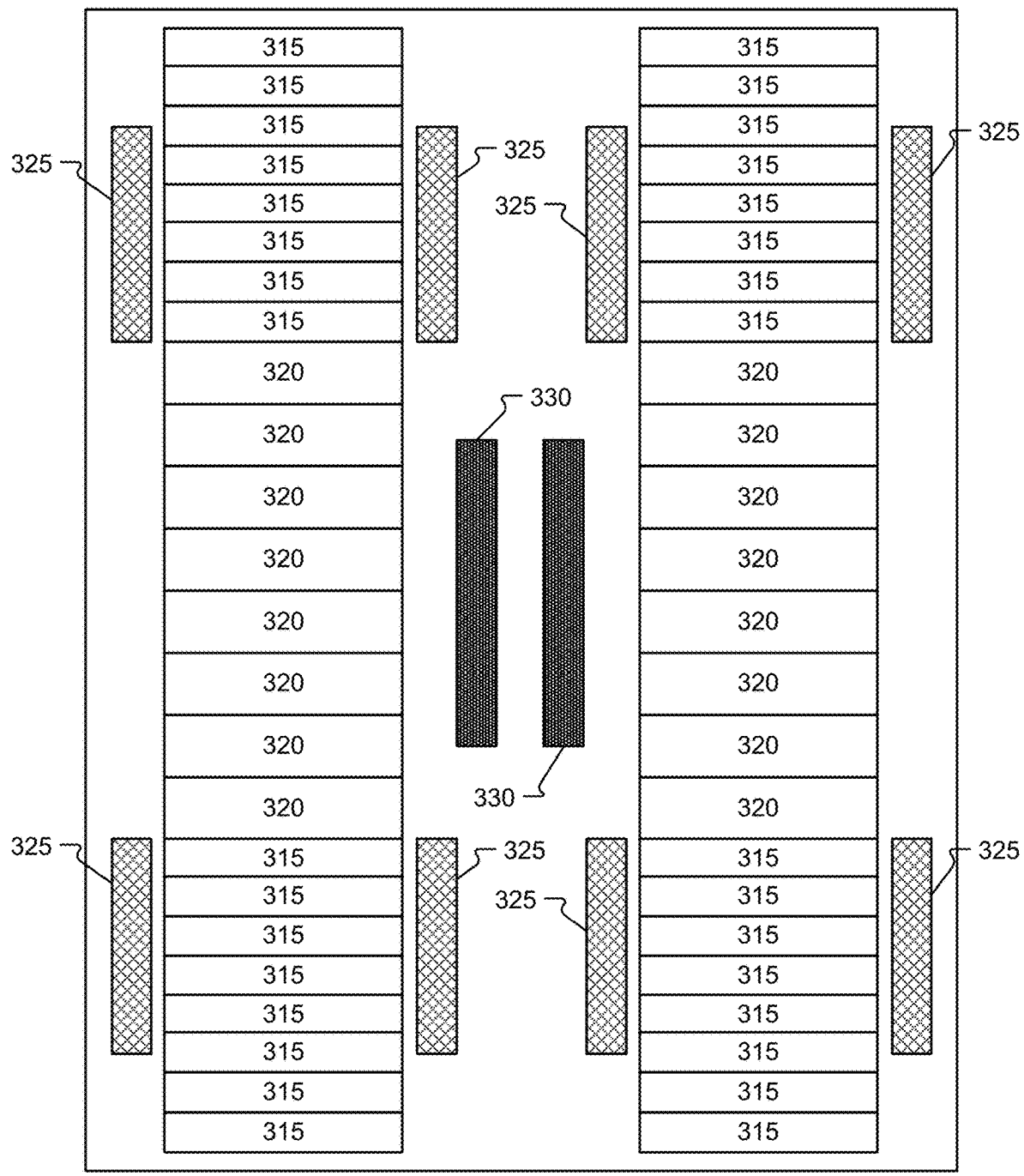
Figure 3C:
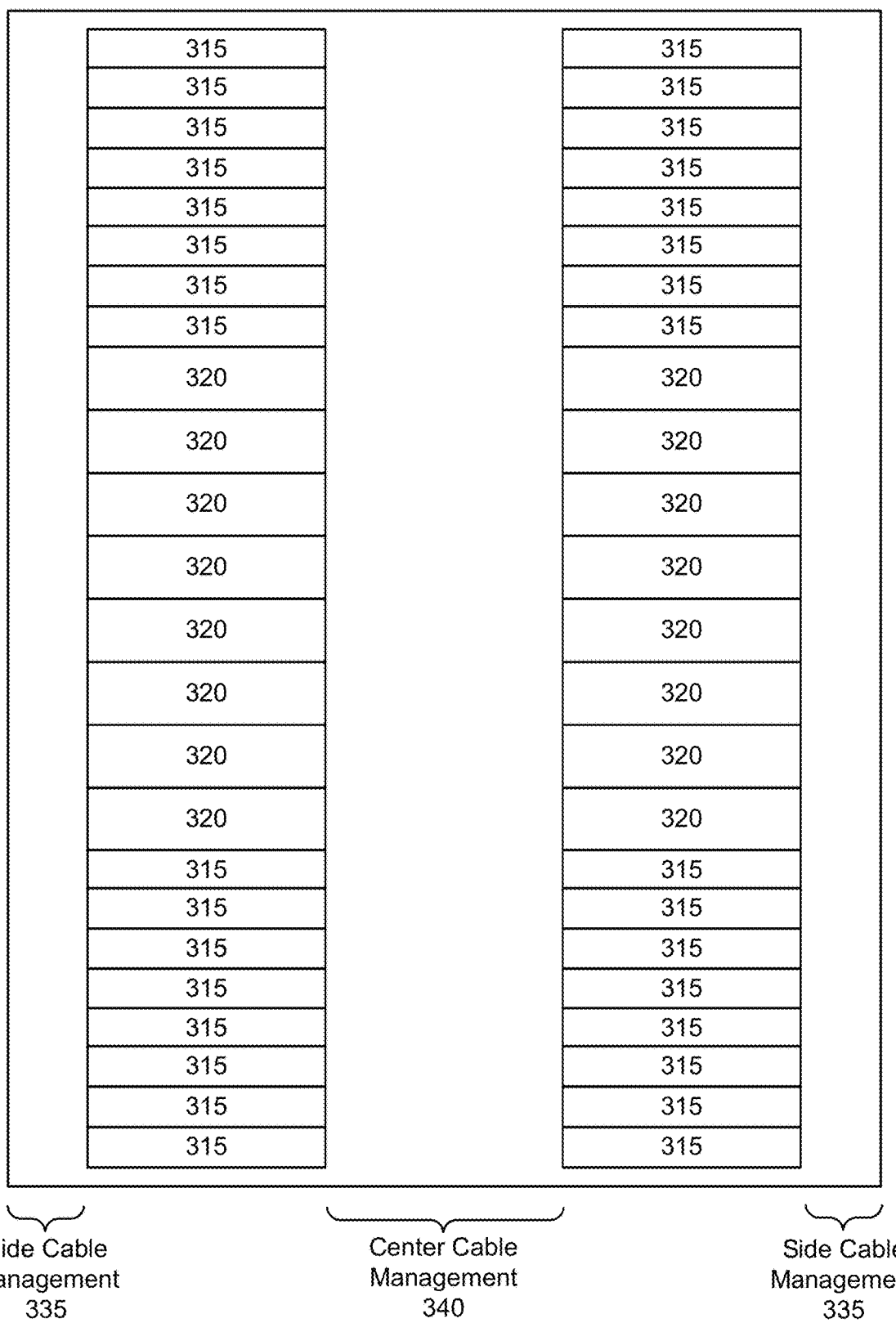

FIGS. 3A, 3B, and 3C illustrate various views of a switch system 300 in accordance with aspects of the present disclosure. In some examples, the switch system 300 may include or represent one or more racks designed to hold one or more network switches for routing data between endpoints in network systems (e.g., datacenters). Additionally, the switch system 300 may include a chassis that is manufactured to accommodate and hold one or more CRUs and any cables to support the CRUs. For example, the CRUs may include network switches. As a non-limiting example, the switch system 300 may represent a director switch as described with reference to FIGS. 1 and 2. Accordingly, the CRUs that can be placed into the switch system 300 may include leaf layers/switches, spine layers/switches, or other types of network switches. As shown in the example of FIG. 3A, the switch system 300 may include a front side 305 and a back side 310.

FIG. 3B illustrates an example schematic of the front side 305 of the switch system 300. In some examples, the front side 305 may be referred to as the cold side or cold aisle side of the switch system 300. As described previously, the switch system 300 may include one or more CRUs. For example, the one or more CRUs may include a first type of network switches 315 (e.g., leaf switches) and a second type of network switches 320 (e.g., spine switches). Additionally, the front side 305 may also include one or more power distribution units (PDUs) 325 to provide electrical power for any components that need electricity on the switch system 300 or for additional component to support operation of the switch system 300. In some examples, the switch system 300 may also include a third type of network switch 330 (e.g., Ethernet switches) to provide additional features and support to the switch system 300.

FIG. 3C illustrates an example schematic of the back side 310 of the switch system 300. In some examples, the back side 310 may be referred to as the hot side or hot aisle side of the switch system 300. The back side 310 includes access to the rear of the first type of network switches 315 and the second type of network switches 320 as described with reference to FIG. 3B. Additionally, the back side 310 includes areas for side cable management 335 and an area for center cable management 340. These areas for cable management allow for any cables needed to connect the different components of the switch system 300 to be arranged in an orderly fashion without getting in the way or affecting the performance of the switch system 300.

Figure 4:
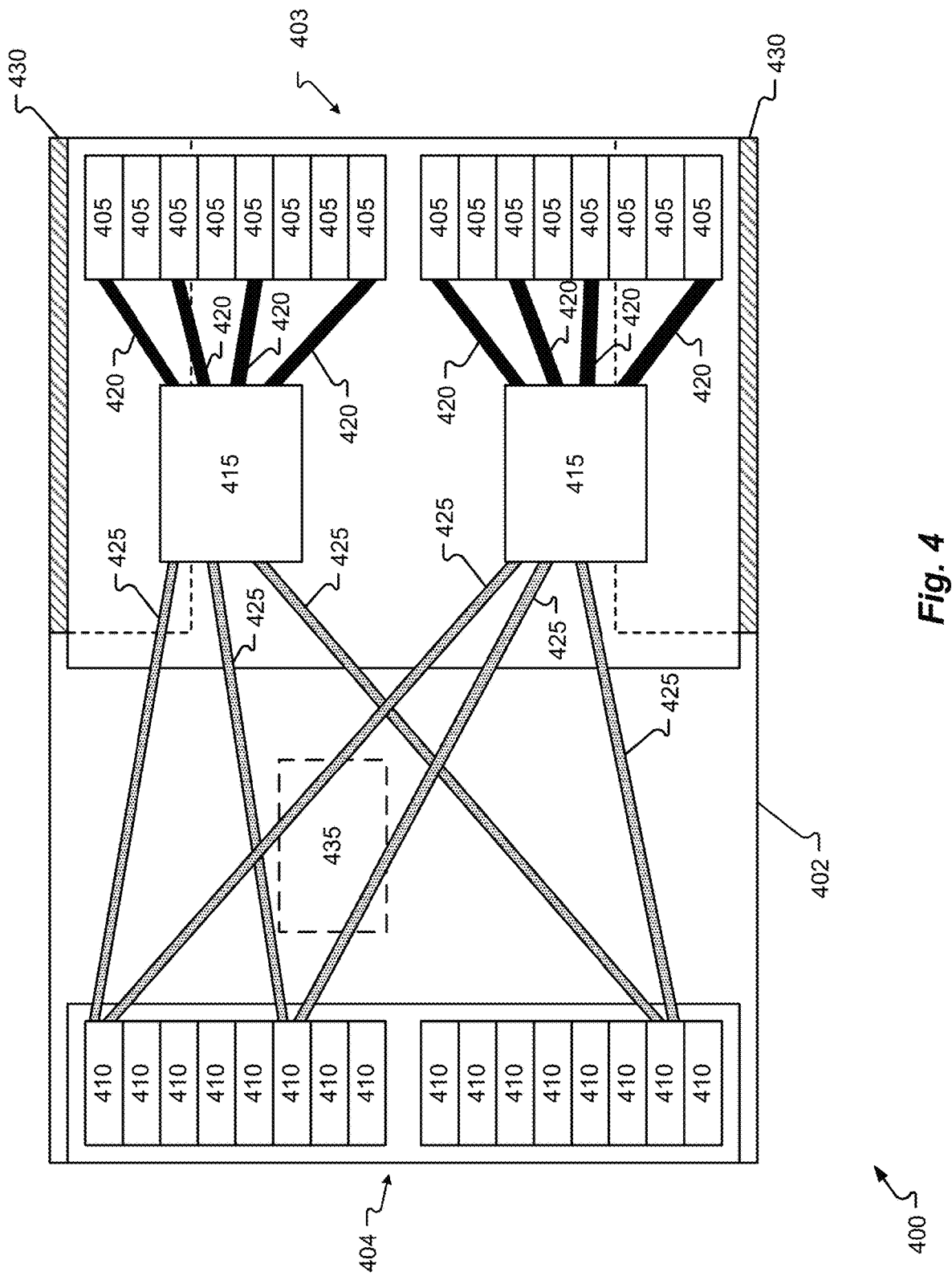
FIG. 4 illustrates a switch schematic for a network switch in accordance with embodiments of the present disclosure.

As described herein and in more detail with reference to FIG. 4, the different types of network switches 315 and 320 may use a standalone switch concept for their designs. While described in the context of the switch system 300 (e.g., a director switch), the standalone switch concept described herein can be used for various network topologies, including director switches, dragonfly switch datacenter network topologies, fat-tree topologies, etc. In some examples, this standalone switch concept may be referred to as a dual side port switch, a dual connect switch module, dual side pluggable panel connector switch, a modular network switch structure, or any similarly termed module. As can be inferred from these different descriptors for the standalone switch concept, the standalone switch concept may include two sets of pluggable panel connectors (e.g., ports) on opposite sides of the standalone switch (e.g., a first set on a first side and a second set on an opposing second side of a substrate of the switch).

These two sets of pluggable panel connectors may connect to a switch IC mounted between the two sides of the switch, where the switch IC is connected to the first set and to the second set of pluggable panel connectors via electrical connections (e.g., electrical traces, wires, etc.) and/or an optical connection. In some examples, the switch system 300 may include a ToR switch mounted in the chassis, where a cable of the switch system 300 connects at least one pluggable panel connector of the standalone switch with a port of the ToR switch.

These standalone switches can be interchangeably mounted into the switch system 300 (e.g., into a chassis as shown in the example of FIG. 3A) for the different types of network switches 315 and 320. That is, due to the modular structure of this standalone switch concept, many switch topologies and sizes can be built easily by mounting the standalone switches (e.g., leaf switches, spine switches, generic network switches, etc.) on passive racks and connecting them with standard cables. Additionally, the chassis can be mounted on standard rack. With this modular design, the standalone switches may also reduce a need of redesigns and replacement of network switches for future generations and designs of switch systems.

FIG. 4 illustrates a schematic 400 of a standalone switch in accordance with aspects of the present disclosure. As described herein, the schematic 400 may represent a standalone switch concept that can be used for different types of network switches and for different switch systems and topographies. For example, this standalone switch concept may generally be referred to as a dual side port switch or dual connect switch module and can be used to serve as a leaf switch, a spine switch, or a different kind of network switch. Additionally, the standalone switch concept can be applied or used in director switches, dragonfly network topologies, etc.

The standalone switch includes a substrate 402 (e.g., a PCB) that has a first side 403 (e.g., front-side) and a second side 404 (e.g., rear-side), such that the second side 404 is an opposing side to the first side 403. Both the first side 403 and the second side 404 may respectively include a set of pluggable panel connectors (e.g., ports). For example, the first side 403 of the substrate 402 may include a first set of pluggable panel connectors 405, and the second side 404 of the substrate 402 may include a second set of pluggable panel connectors 410.

In some examples, the substrate 402 can be mounted in a chassis (e.g., as described with reference to FIGS. 3A to 3C) such that one of the first set of pluggable panel connectors 405 and the second set of pluggable panel connectors 410 are exposed on a side of the chassis that is accessible for plugging and unplugging cables. That is, each pluggable panel connector in the first set of pluggable panel connectors 405 is configured to receive a pluggable cable, and each pluggable panel connector in the second set of pluggable panel connectors 410 is configured to receive another pluggable cable. For example, a cable can connect at least one pluggable panel connector in the first set of pluggable panel connectors 405 and/or the second set of pluggable panel connectors 410 with a port of an external network device, an additional network device, another network switch, etc. Additionally or alternatively, in the example deployment of a director switch that includes the standalone switch, at least one of the second set of pluggable panel connectors 410 may be connected to a backplane of the director switch. In some examples, the first set of pluggable panel connectors 405 and the second set of pluggable panel connectors 410 may be OSFP ports, fiber optic ports, electrical ports, electromechanical ports, etc.

As shown in the example of FIG. 4, a number of pluggable panel connectors in the first set of pluggable panel connectors 405 may be equal to a number of pluggable panel connectors in the second set of pluggable panel connectors 410. Additionally or alternatively, the number of pluggable panel connectors in the first set of pluggable panel connectors 405 may be different from (e.g., greater than or less than) the number of pluggable panel connectors in the second set of pluggable panel connectors 410. Additionally, while 16 pluggable panel connectors are shown for each of the first set of pluggable panel connectors 405 and the second set of pluggable panel connectors 410 or 32 pluggable panel connectors (e.g., two (2) pluggable panel connectors exist for each instance of the pluggable panel connectors shown for each set), the standalone switch may include a greater amount or lesser amount of pluggable panel connectors in each set. Additionally, the first set of pluggable panel connectors 405 and the second set of pluggable panel connectors 410 may operate using a common communication protocol.

Additionally, the standalone switch may include one or more switch ICs 415 that are mounted on the substrate 402 between the first side 403 and the second side 404. The standalone switch may include a single switch IC 415 or two switch ICs 415 (as shown). The switch ICs 415 may be connected to at least one of the first set of pluggable panel connectors 405 and/or at least one of the second set of pluggable panel connectors 410. For example, a first switch IC 415 may be connected to the first set of pluggable panel connectors 405 via one or more connections 420 and to the second set of pluggable panel connectors 410 via one or more connections 425. Additionally or alternatively, with two switch ICs 415, each pluggable panel connector in the first set of pluggable panel connectors 405 is connected to one of the first switch IC 415 and a second switch IC 415, and each pluggable panel connector in the second set of pluggable panel connectors 410 is connected to both of the first switch IC 415 and the second switch IC 415. In some examples, lanes (e.g., the connections 425) of the second set of pluggable panel connectors 410 are split between the first switch IC 415 and the second switch IC 415.

The connectors 420 and 425 may include electrical connections and/or optical connections between the switch ICs 415 and the respective sets of pluggable panel connectors. For example, the connectors 420 and 425 may include electrical traces (e.g., PCB routings), wires, optical connections, or a combination thereof.

In some examples, the standalone switch may also include one or more power supply units (PSUs) 430 mounted on the substrate 402. The PSU(s) 430 may be mounted onto the substrate 402 to provide power to the one or more switch ICs 415. Additionally or alternatively, a main power supply may be mounted on the chassis into which the standalone switch and substrate 402 themselves are mounted that can provide power to the standalone switch and the switch ICs 415.

Additionally, the standalone switch may also include a management module 435 that manages one or more on-board functions of the switch. For example, the one or more on-board functions managed by the management module 435 may include at least one of cooling functions (e.g., controlling cooling fans mounted on the substrate 402), power supply functions (e.g., controlling the one or more PSUs 430), security functions (e.g., performing encoding/decoding functions, operating an encoder/decoder mounted on the substrate 402, etc.), and data transfer functions (e.g., routing the correct data from between the two sets of pluggable panel connectors). The management module 435 may further enable the standalone switch to operate independently by controlling the one or more on-board functions without the need of additional components or network switches.

Any of the steps, functions, and operations discussed herein can be performed continuously and automatically.

The exemplary systems and methods of this disclosure have been described in relation to a dual connect switch module. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Exemplary aspects are directed to a switch (e.g., dual connect switch module) comprising a substrate having a first side and an opposing second side; a first set of pluggable panel connectors provided on the first side of the substrate; a second set of pluggable panel connectors provided on the second side of the substrate; and a switch Integrated Circuit (IC) mounted on the substrate between the first side and the second side, where the switch IC is connected to the first set of pluggable panel connectors and to the second set of pluggable panel connectors.

Any one or more of the above aspects include wherein the substrate is mounted in a chassis such that one of the first set of pluggable panel connectors and the second set of pluggable panel connectors are exposed on a side of the chassis that is accessible for plugging and unplugging cables.

Any one or more of the above aspects include wherein a cable connects at least one pluggable panel connector in the first set of pluggable panel connectors with a port of an external network device.

Any one or more of the above aspects include wherein a cable connects at least one pluggable panel connector in the second set of pluggable panel connectors with an external network device.

Any one or more of the above aspects include wherein the switch IC is connected to the first set of pluggable panel connectors with at least one of electrical traces, wires, and optical connections.

Any one or more of the above aspects include wherein the switch further comprises a power supply unit mounted on the substrate, where the power supply unit provides power to the switch IC.

Any one or more of the above aspects include wherein the switch further comprises a second switch IC mounted on the substrate, where each pluggable panel connector in the first set of pluggable panel connectors is connected to one of the switch IC and the second switch IC, and where each pluggable panel connector in the second set of pluggable panel connectors is connected to both of the switch IC and the second switch IC.

Any one or more of the above aspects include wherein lanes of the second set of pluggable panel connectors are split between the switch IC and the second switch IC.

Any one or more of the above aspects include wherein a number of pluggable panel connectors in the first set of pluggable panel connectors is equal to a number of pluggable panel connectors in the second set of pluggable panel connectors.

Any one or more of the above aspects include wherein each pluggable panel connector in the first set of pluggable panel connectors is configured to receive a pluggable cable, and each pluggable panel connector in the second set of pluggable panel connectors is configured to receive another pluggable cable.

Any one or more of the above aspects include wherein the first set of pluggable panel connectors and the second set of pluggable panel connectors operate using a common communication protocol.

Any one or more of the above aspects include wherein the switch further comprises a management module that manages one or more on-board functions of the switch.

Any one or more of the above aspects include wherein the one or more on-board functions managed by the management module comprise at least one of cooling functions, power supply functions, security functions, and data transfer functions.

Any one or more of the above aspects include wherein the switch IC is connected to the first set of pluggable panel connectors and to the second set of pluggable panel connectors via an electrical connection.

Any one or more of the above aspects include wherein the switch IC is connected to the first set of pluggable panel connectors and to the second set of pluggable panel connectors via an optical connection.

Exemplary aspects are directed to a system comprising a chassis; a cable; and a switch mounted in the chassis. The switch comprises a first set of pluggable panel connectors provided on a first side of the switch; a second set of pluggable panel connectors provided on a second side of the switch, where at least one pluggable panel connector in the second set of pluggable panel connectors is connected to the cable; and a switch IC mounted between the first side and the second side, where the switch IC is electrically connected to the first set of pluggable panel connectors and to the second set of pluggable panel connectors.

Any one or more of the above aspects include wherein the system further comprises a second switch mounted in the chassis and connected to the switch via the cable.

Any one or more of the above aspects include wherein the second switch comprises a first set of pluggable panel connectors provided on a first side of the second switch; a second set of pluggable panel connectors provided on a second side of the second switch; and a second switch IC mounted between the first side of the second switch and the second side of the second switch, where the second switch IC is connected to the first set of pluggable panel connectors of the second switch and to the second set of pluggable panel connectors of the second switch.

Any one or more of the above aspects include wherein the cable connects at least one pluggable panel connector in at least one of the first set of pluggable panel connectors and the second set of pluggable panel connectors with a port of an external network device.

Any one or more of the above aspects include wherein the switch IC is connected to the first set of pluggable panel connectors with at least one of electrical traces, wires, and optical connections, and the switch IC is connected to the second set of pluggable panel connectors with at least one of electrical traces, wires, and optical connections.

Any one or more of the above aspects include wherein the switch of the system further comprises a management module that manages one or more on-board functions of the switch, where the one or more on-board functions managed by the management module comprise at least one of cooling functions, power supply functions, security functions, and data transfer functions.

Exemplary aspects are directed to a switch comprising a first set of pluggable panel connectors provided on a first side of the switch; a second set of pluggable panel connectors provided on a second side of the switch; a first switch IC mounted between the first side of the switch and the second side of the switch, where the first switch IC is connected to the first set of pluggable panel connectors and the second set of pluggable panel connectors; and a second switch IC mounted between the first side of the switch and the second side of the switch, where the second switch IC is connected to the first set of pluggable panel connectors and the second set of pluggable panel connectors.

Any one or more of the above aspects include wherein each pluggable panel connector in the first set of pluggable panel connectors is connected to one of the first switch IC and the second switch IC, and each pluggable panel connector in the second set of pluggable panel connectors is connected to both of the first switch IC and the second switch IC.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A switch, comprising:
   a substrate having a first side and an opposing second side;
   a first set of pluggable panel connectors provided on the first side of the substrate;
   a second set of pluggable panel connectors provided on the second side of the substrate; and
   a switch Integrated Circuit (IC) mounted on the substrate between the first side and the second side, wherein the switch IC is connected to the first set of pluggable panel connectors and to the second set of pluggable panel connectors.

2. The switch of claim 1, wherein the substrate is mounted in a chassis such that one of the first set of pluggable panel connectors and the second set of pluggable panel connectors are exposed on a side of the chassis that is accessible for plugging and unplugging cables.

3. The switch of claim 2, wherein a cable connects at least one pluggable panel connector in the first set of pluggable panel connectors with a port of an external network device.

4. The switch of claim 2, wherein a cable connects at least one pluggable panel connector in the second set of pluggable panel connectors with a port of an external network device.

5. The switch of claim 2, wherein the switch IC is connected to the first set of pluggable panel connectors with at least one of electrical traces, wires, and optical connections.

6. The switch of claim 1, further comprising:
   a power supply unit mounted on the substrate, wherein the power supply unit provides power to the switch IC.

7. The switch of claim 1, further comprising:
   a second switch IC mounted on the substrate, wherein each pluggable panel connector in the first set of pluggable panel connectors is connected to one of the switch IC and the second switch IC, and wherein each pluggable panel connector in the second set of pluggable panel connectors is connected to both of the switch IC and the second switch IC.

8. The switch of claim 7, wherein lanes of the second set of pluggable panel connectors are split between the switch IC and the second switch IC.

9. The switch of claim 1, wherein a number of pluggable panel connectors in the first set of pluggable panel connectors is equal to a number of pluggable panel connectors in the second set of pluggable panel connectors.

10. The switch of claim 1, wherein each pluggable panel connector in the first set of pluggable panel connectors is configured to receive a pluggable cable and wherein each pluggable panel connector in the second set of pluggable panel connectors is configured to receive another pluggable cable.

11. The switch of claim 1, wherein the first set of pluggable panel connectors and the second set of pluggable panel connectors operate using a common communication protocol.

12. The switch of claim 1, further comprising:
    a management module that manages one or more on-board functions of the switch.

13. The switch of claim 12, wherein the one or more on-board functions managed by the management module comprise at least one of cooling functions, power supply functions, security functions, and data transfer functions.

14. The switch of claim 1, wherein the switch IC is connected to the first set of pluggable panel connectors and to the second set of pluggable panel connectors via an electrical connection.

15. The switch of claim 1, wherein the switch IC is connected to the first set of pluggable panel connectors and to the second set of pluggable panel connectors via an optical connection.

16. A system, comprising:
    a chassis;
    a cable; and
    a switch mounted in the chassis, wherein the switch comprises:
       a first set of pluggable panel connectors provided on a first side of the switch;
       a second set of pluggable panel connectors provided on a second side of the switch, wherein at least one pluggable panel connector in the second set of pluggable panel connectors is connected to the cable; and
       a switch Integrated Circuit (IC) mounted between the first side and the second side, wherein the switch IC is electrically connected to the first set of pluggable panel connectors and to the second set of pluggable panel connectors.

17. The system of claim 16, further comprising:
    a second switch mounted in the chassis and connected to the switch via the cable.

18. The system of claim 17, wherein the second switch comprises:
    a first set of pluggable panel connectors provided on a first side of the second switch;
    a second set of pluggable panel connectors provided on a second side of the second switch; and
    a second switch IC mounted between the first side of the second switch and the second side of the second switch, wherein the second switch IC is connected to the first set of pluggable panel connectors of the second switch and to the second set of pluggable panel connectors of the second switch.

19. The system of claim 16, wherein the cable connects at least one pluggable panel connector in at least one of the first set of pluggable panel connectors and the second set of pluggable panel connectors with a port of an external network device.

20. The system of claim 16, wherein the switch IC is connected to the first set of pluggable panel connectors with at least one of electrical traces, wires, and optical connections, and wherein the switch IC is connected to the second set of pluggable panel connectors with at least one of electrical traces, wires, and optical connections.

21. The system of claim 16, wherein the switch further comprises:
    a management module that manages one or more on-board functions of the switch, wherein the one or more on-board functions managed by the management module comprise at least one of cooling functions, power supply functions, security functions, and data transfer functions.

22. A switch, comprising:
    a first set of pluggable panel connectors provided on a first side of the switch;
    a second set of pluggable panel connectors provided on a second side of the switch;
    a first switch Integrated Circuit (IC) mounted between the first side of the switch and the second side of the switch, wherein the first switch IC is connected to the first set of pluggable panel connectors and the second set of pluggable panel connectors; and
    a second switch IC mounted between the first side of the switch and the second side of the switch, wherein the second switch IC is connected to the first set of pluggable panel connectors and the second set of pluggable panel connectors.

23. The switch of claim 22, wherein each pluggable panel connector in the first set of pluggable panel connectors is connected to one of the first switch IC and the second switch IC, and wherein each pluggable panel connector in the second set of pluggable panel connectors is connected to both of the first switch IC and the second switch IC.

* * * * *